United States Patent
Otsuki et al.

(10) Patent No.: US 12,241,153 B2
(45) Date of Patent: Mar. 4, 2025

(54) SPUTTERING TARGET AND MANUFACTURING METHOD THEREFOR

(71) Applicant: JX Advanced Metals Corporation, Tokyo (JP)

(72) Inventors: Tomio Otsuki, Ibaraki (JP); Yasushi Morii, Ibaraki (JP)

(73) Assignee: JX Advanced Metals Corporation, Tokyo (JP)

( * ) Notice: Subject to any disclaimer, the term of this patent is extended or adjusted under 35 U.S.C. 154(b) by 0 days.

(21) Appl. No.: 18/207,721

(22) Filed: Jun. 9, 2023

(65) Prior Publication Data

US 2023/0349035 A1  Nov. 2, 2023

Related U.S. Application Data

(62) Division of application No. 16/491,151, filed as application No. PCT/JP2018/010629 on Mar. 16, 2018, now Pat. No. 11,718,907.

(30) Foreign Application Priority Data

Mar. 30, 2017  (JP) .................................. 2017-068457
Mar. 6, 2018  (JP) .................................. 2018-040212

(51) Int. Cl.
*C23C 14/34* (2006.01)
*C22C 9/01* (2006.01)
(Continued)

(52) U.S. Cl.
CPC ............ *C23C 14/3414* (2013.01); *C22C 9/01* (2013.01); *C22C 9/05* (2013.01); *C22C 9/06* (2013.01); *C22F 1/08* (2013.01)

(58) Field of Classification Search
CPC ..... C22C 9/01; C22C 9/05; C22C 9/06; C22F 1/08; C23C 14/34; H01J 37/3435
See application file for complete search history.

(56) References Cited

U.S. PATENT DOCUMENTS

| | | |
|---|---|---|
| 2004/0072009 A1 | 4/2004 | Segal et al. |
| 2005/0121320 A1 | 6/2005 | Okabe et al. |

(Continued)

FOREIGN PATENT DOCUMENTS

| | | |
|---|---|---|
| EP | 2733235 A1 | 5/2014 |
| JP | H11158614 A | 6/1999 |

(Continued)

OTHER PUBLICATIONS

Search Report in International Application No. PCT/JP2018/010629 dated Jun. 19, 2018, 2 pages.

(Continued)

*Primary Examiner* — Anthony M Liang
*Assistant Examiner* — Jacob J Gusewelle
(74) *Attorney, Agent, or Firm* — Marshall, Gerstein & Borun LLP

(57) ABSTRACT

A sputtering target according to one embodiment is an integrated sputtering target comprising a target portion and a backing plate portion, both of them being made of copper and unavoidable impurities, wherein a Vickers hardness Hv is 90 or more, and wherein a flat ratio of crystal grains in a cross section orthogonal to a sputtering surface is 0.35 or more and 0.65 or less.

10 Claims, 1 Drawing Sheet

(51) Int. Cl.
  *C22C 9/05* (2006.01)
  *C22C 9/06* (2006.01)
  *C22F 1/08* (2006.01)

(56) References Cited

U.S. PATENT DOCUMENTS

| | | |
|---|---|---|
| 2012/0328468 A1 | 12/2012 | Kumagai et al. |
| 2014/0158532 A1 | 6/2014 | Nagata et al. |
| 2014/0367253 A1 | 12/2014 | Okabe et al. |
| 2016/0047017 A1 | 2/2016 | Maki et al. |

FOREIGN PATENT DOCUMENTS

| | | | | |
|---|---|---|---|---|
| JP | 2002121662 A | * | 4/2002 | |
| JP | 4118814 B2 | | 7/2008 | |
| JP | 4790782 B2 | * | 10/2011 | ............... C22C 9/01 |
| JP | 4976013 B2 | | 7/2012 | |
| JP | 5277808 B2 | | 8/2013 | |
| JP | 2013253309 A | | 12/2013 | |
| JP | 2015-061943 A | | 4/2015 | |
| WO | WO-2013/0105424 A1 | | 7/2013 | |
| WO | WO-2015/0151901 A1 | | 10/2015 | |

OTHER PUBLICATIONS

International Preliminary Report on Patentability in International Application No. PCT/JP2018/010629 dated Oct. 3, 2019, 9 pages.
Extended European Search Report in EP Application No. 18776501.1 dated Jan. 18, 2021, 8 pages.

\* cited by examiner

SPUTTERING TARGET AND MANUFACTURING METHOD THEREFOR

CROSS-REFERENCE TO RELATED APPLICATIONS

This application is a divisional of U.S. application Ser. No. 16/491,151 filed Sep. 4, 2019, which is the U.S. national stage of PCT/JP2018/010629 filed Mar. 16, 2018, which claims the priority benefit of JP Application No. 2017-068457 filed Mar. 30, 2017, and JP Application No. 2018-040212 filed Mar. 6, 2018, the respective disclosures of which are hereby incorporated by reference in their entirety for all purposes herein.

TECHNICAL FIELD

This invention discloses an art relating to a sputtering target and a method for manufacturing the same.

BACKGROUND ART

Recently, refinement of wiring for semiconductor elements has progressed. The refinement of the wiring has led to the use of copper having a lower resistance as a material of the wiring in place of aluminum which has been conventionally used. The wire of this type may be formed, for example, by forming a diffusion barrier layer made of Ta/TaN or the like in a contact hole or a recess of a wiring gutter and then performing copper electroplating. Here, as a base layer for the electroplating, a thin film of copper or a copper alloy is usually formed by means of sputtering.

A sputtering target made of copper or a copper alloy that can be used for such sputtering and a method for manufacturing the same are disclosed, for example, in Patent Documents 1 to 5.

The sputtering target made of copper or copper alloy as described above is generally composed of a target material having a sputtering surface used for sputtering, and a backing plate having functions of cooling the target material during sputtering and of a sputtering electrode or the like. In order to produce such a sputtering target, the backing plate and the target material separately produced therefrom and made of a different predetermined material by melt casting or the like are bonded to each other by using a bonding agent or the like.

However, as described above, when bonding the backing plate and the target material separately produced to manufacture a sputtering target, a number of steps is increased due to the separate production of the backing plate and the target material or bonding of them to each other, as well as the target material will be thinner by the thickness of the backing plate, resulting in a shorter life.

To address the problem, an integrated sputtering target, a so-called monolithic target, has been proposed in which both of a target portion and a backing plate portion are made of the same copper or copper alloy, as described in Patent Documents 6 and 7 or the like. According to such an integrated sputtering target, the target portion and the backing plate portion can be integrally manufactured at the same time, so that bonding of them to each other is not required, and the number of manufacturing steps is decreased, and it can contribute to reduction of costs for a user of target due to the increased using time during sputtering.

CITATION LIST

Patent Literatures

Patent Document 1: Japanese Patent Application Publication No. 2015-61943 A
Patent Document 2: US Patent Application Publication No. 2014/0158532 A1
Patent Document 3: Japanese Patent No. 4118814 B
Patent Document 4: US Patent Application Publication No. 2005/0121320 A1
Patent Document 5: Japanese Patent No. 5277808 B
Patent Document 6: Japanese Patent No. 4976013 B
Patent Document 7: US Patent Application Publication No. 2004/0072009 A1

SUMMARY OF INVENTION

Technical Problem

In the integrated sputtering target in which both of the target portion and the backing plate portion are made of copper or a copper alloy, the backing plate portion will be necessarily made of the same material as that of the target portion having predetermined material properties or characteristics for enabling formation of a predetermined thin film by sputtering. Therefore, the integrated sputtering target will have a lower hardness than that of a separate type sputtering target that can employ a high hardness backing plate made of other material.

Such a decrease in the hardness of the target tends to generate warpage of the sputtering target during sputtering.

In fact, Patent Documents 6 and 7 state:
"the copper alloy sputtering target according to the present invention may have a Brinell hardness of at least about 40 HB. In some cases, the target according to the present invention may have a hardness of about 60 HB or more".

The sputtering target having such a low degree of hardness may cause warpage during sputtering, which may result in difficulty of continued use.

To solve such problems, the present disclosure proposes an integrated sputtering target including a target portion and a backing plate portion which have the same type of copper and unavoidable impurities or which contains predetermined elements, the balance being copper and unavoidable impurities, in which the sputtering target can effectively prevent a decrease in target hardness that otherwise may cause generation of warpage during sputtering; and a method for manufacturing the same.

Solution to Problem

As a result of intensive studies for a method of increasing hardness of a sputtering target in which the target portion and the backing plate portion are integrated, the present inventors have found that, in the previous manufacturing method characterized by sequentially perform forging, rolling and a heat treatment on an ingot obtained by melt casting, a predetermined cold plastic processing is further carried out after the heat treatment so that strain is introduced, thereby enabling an increase in the hardness of the produced sputtering target.

Based on such findings, the sputtering target disclosed in the present disclosure relates to an integrated sputtering target comprising a target portion and a backing plate portion, both of them being made of copper and unavoidable impurities, wherein a Vickers hardness Hv is 90 or more, and wherein a flat ratio of crystal grains in a cross section orthogonal to a sputtering surface is 0.35 or more and 0.65 or less.

A method for manufacturing a sputtering target disclosed in the present disclosure relates to a method for manufacturing an integrated sputtering target comprising a target portion and a backing plate portion, both of them being made of copper and unavoidable impurities, the method comprising: melting a raw material to cast an ingot comprising copper and unavoidable impurities; and subjecting the ingot to hot forging, first cold rolling or first cold forging, a heat treatment, and second cold rolling or second cold forging in this order, wherein the second cold rolling or the second cold forging is carried out at a change rate of from 20% to 40%.

Further, a sputtering target disclosed in the present disclosure relates to an integrated sputtering target comprising a target portion and a backing plate portion, both of them containing from 0.1% by mass to 8% by mass of at least one element selected from aluminum, manganese, nickel and cobalt, the balance being copper and unavoidable impurities, wherein a Vickers hardness Hv is 90 or more, and a flat ratio of crystal grains in a cross section orthogonal to a sputtering surface is 0.35 or more and 0.85 or less.

Further, a method for manufacturing a sputtering target disclosed in the present disclosure relates to a method for manufacturing an integrated sputtering target comprising a target portion and a backing plate portion, both of them containing from 0.1% by mass to 8% by mass of at least one element selected from aluminum, manganese, nickel and cobalt, the balance being copper and the inevitable impurities, the method comprising: melting a raw material to cast an ingot comprising the element, copper and the unavoidable impurities; and subjecting the ingot to hot forging, first cold rolling or first cold forging, a heat treatment, and a second cold rolling or a second cold forging in this order, wherein the second cold rolling or the second cold forging is carried out at a change rate of from 20% to 60%.

Advantageous Effects of Invention

According to the sputtering target as described above, the target is of integral type in which both of the target portion and the backing plate portion are made of copper and unavoidable impurities, or of integral type in which they contain predetermined elements, the balance being copper and unavoidable impurities, and the predetermined Vickers hardness Hv can effectively prevent generation of warpage during sputtering.

Further, according to the above method for manufacturing the sputtering target, the second cold rolling or the second cold forging is carried out after the heat treatment, and the change rate of the second cold rolling or the second cold forging is set to be the predetermined range, whereby a sputtering target with high hardness can be manufactured.

DESCRIPTION OF THE PREFERRED EMBODIMENTS

Hereinafter, embodiments of the invention disclosed in the specification will be described in detail.

Sputtering Target and Manufacturing Method According to First Embodiment

A sputtering target according to this embodiment is of integrated type including: a disk-shaped target portion; and a backing plate portion which has substantially the same shape as the target portion and is integral with the target portion, in which both of the target portion and the backing plate portion are made of equivalent copper and unavoidable impurities, and in which a Vickers hardness Hv is 90 or more, and a flat ratio of crystal grains in a cross section orthogonal to a sputtering surface is 0.35 or more and 0.65 or less. In the present embodiment, the sputtering target generally has a plate shape such as a disk shape, but may include other shapes. Whether or not the sputtering target is of integral type can be determined by confirming whether or not materials of a front surface and a back surface of the sputtering target are the same as each other. Since the sputtering target is made of cupper, the determination can be made by measuring conductivity.

(Composition)

In the sputtering target according to the present embodiment, both of the target portion and the backing plate portion contain copper as a main component, and may further contain at least other elements as long as the Vickers hardness Hv as described below will be maintained to be 90 or more. The copper content in the target portion and the backing plate portion is preferably 99.99% by mass or more, and more preferably 99.9999% by mass or more. If the copper content is too low, there is a concern that serious defects may occur when used in semiconductor products.

Both of the target portion and the backing plate portion may be comprised only of copper, but they may contain, as the impurities as described above, one or more element selected from the group consisting of Fe, Cr, Ni, Si, Ag, S and P, for example in a total amount of 0.01% by mass or less, and preferably 0.005% by mass or less. If the total content of the above elements is more than 0.01% by mass, serious defects may occur when used in semiconductor products.

However, the elements are not limited to those listed herein, and other elements can be contained as long as the Vickers hardness Hv of 90 or more can be ensured.

(Vickers Hardness)

The sputtering target according to the present embodiment has a Vickers hardness Hv of 90 or more. This can allow suppression of warpage during sputtering, even if the sputtering target provided with the backing plate portion which mainly consists of copper as in the target portion, and even if it is such a sputtering target having a diameter of more than 400 mm for example. As a result, effective sputtering can be carried out until the latter half of the life of the sputtering target. From this viewpoint, the Vickers hardness Hv of the sputtering target is 90 or more, and preferably 97 or more.

On the other hand, if the hardness is too high, there is a concern that recrystallization may occur during sputtering due to heat caused by sputtering, resulting in softening. Therefore, the Vickers hardness Hv may be, for example, 125 or less, and preferably 118 or less.

The Vickers hardness Hv is measured in accordance with JIS Z2244 (2009). In the sputtering target in which the target portion and the backing plate portion are integrated, the Vickers hardness Hv of the target portion and the backing plate portion is substantially the same.

Such Vickers hardness Hv can be obtained, for example, by production according to the manufacturing method as described later.

(Average Crystal Grain Size)

In the sputtering target according to the embodiment, an average crystal grain size is preferably 10 µm or more and 60 µm or less. If the average crystal grain size is less than 10 µm, an erosion rate during sputtering may be decreased, and if it is more than 60 µm, film uniformity during sputtering may be deteriorated. Therefore, the average crystal grain size is more preferably 20 µm or more and 50 µm or less, and still more preferably 25 µm or more and 45 µm or less.

Figure 1:
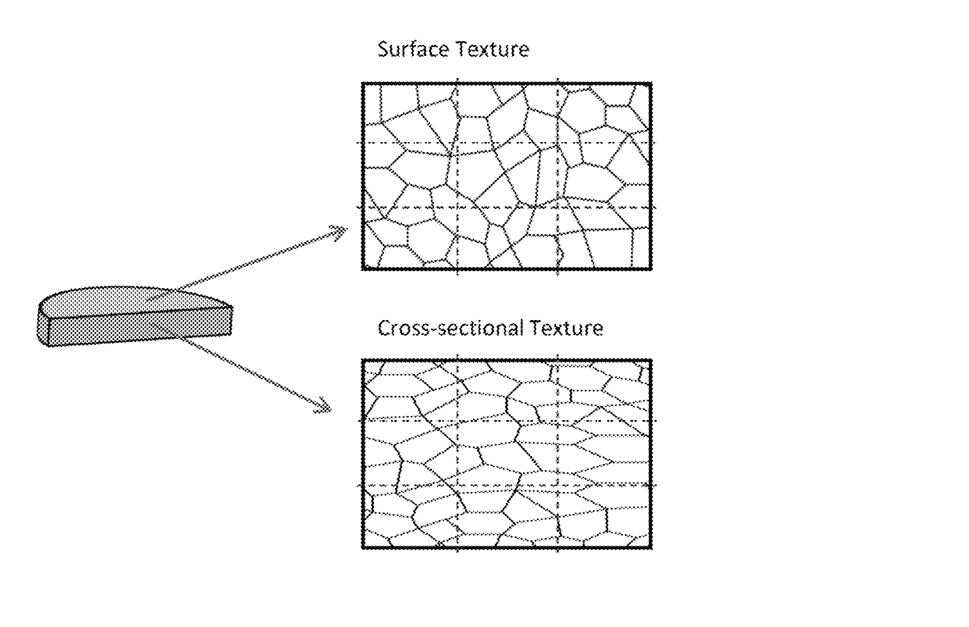
FIG. 1 is a schematic view showing a method of measuring an average crystal grain size and a flat ratio of crystal grains.

The average crystal grain size is measured by observation with an optical microscope. More particularly, as shown in FIG. 1, the average crystal grain size is determined by drawing two straight lines on the sputtering surface in each of a longitudinal direction and a lateral direction to draw four straight lines in total (see "Surface Texture" in FIG. 1), measuring an average grain size in a target thickness direction and an average grain size in a direction perpendicular to the target thickness direction based on the number of grain boundaries intersecting the straight lines, and averaging the average grain sizes in those respective directions.

(Flat Ratio of Crystal Grains)

In the sputtering target according to the embodiment, a flat ratio of crystal grains present in a cross section along a plane orthogonal to the sputtering surface is 0.35 or more and 0.65 or less.

The flat ratio is determined using an optical microscope as follows: total four arbitrary straight lines, two straight lines in each of a target thickness direction and a direction perpendicular to the target thickness direction of the crystal grains observed in the cross section, are drawn (see "Cross-sectional Texture" in FIG. 1), and the number of grain boundaries intersecting the straight lines are counted to measure an average grain size in the target thickness direction and an average grain size in the direction perpendicular to the target thickness direction; and then, when the average grain size in the target thickness direction is defined as a short side and the average grain size in the direction perpendicular to the target thickness direction is defined as a long side, the flat ratio is calculated from the equation: flat ratio=(1−short side/long side).

If the above flat ratio is less than 0.35, the strength would be insufficient because processing deformation of a recrystallized structure is not sufficient. On the other hand, if it is more than 0.65, the erosion rate may decrease because the grain size in the thickness direction is too fine. Further, when the flat ratio is more than 0.65 in pure copper, there is a concern that a recrystallization temperature is decreased due to processing deformation, thereby resulting in softening due to the heat caused by sputtering during sputtering.

Therefore, in the sputtering target according to the embodiment, the flat ratio of crystal grains present in the cross section along the plane orthogonal to the sputtering surface is 0.35 or more and 0.65 or less, and preferably 0.40 or more and 0.60 or less, and more preferably 0.45 or more and 0.55 or less.

The flat ratio of crystal grains in the cross section can be obtained, for example, by production according to the manufacturing method as described later.

(Manufacturing Method)

The sputtering target according to the embodiment can be manufactured, for example, as follows.

First, high purity copper having a purity of 4N or 6N is melted at a temperature of from 1080° C. to 1280° C. for 0.5 hours to 6 hours, and cooled and harden in a predetermined mold, thereby casting an ingot comprised of copper and unavoidable impurities as a material for the sputtering target in which the target portion and the backing plate are integrated.

The ingot is then subjected to hot forging, first cold rolling or first cold forging, a heat treatment, and second cold rolling or second cold forging.

Here, the hot forging is preferably carried out at a temperature of from 300° C. to 900° C. This is because if the temperature during forging is less than 300° C., there is a risk of cracking in the ingot during forging, whereas if it is more than 900° C., copper is abnormally softened, which is dangerous, and abnormal grain growth during forging may take place due to the elevated temperature.

Here, the first cold rolling and the first cold forging are preferably carried out at a change rate of 70% or more, in terms of sufficiently destroying the cast structure. As used herein, the change rate R (%) means a ratio of dimensional changes in the thickness direction, represented by the equation: $R=(T1-T2)/T1\times100$, in which T1 represents a thickness of a target material before rolling or forging, and T2 represents a thickness of a target material after rolling or forging. More particularly, in the case of rolling, the above change rate corresponds to a so-called rolling reduction, which is also calculated by the same equation. The same is true for change rates of the second cold rolling and the second cold forging which will be described later. When calculating the change rate, the thickness of the target material is measured by firstly confirming a sufficiently flat surface of the target material having a disk shape or the like by a flat rod as a base, and then measuring four thicknesses in a circumferential direction at a position of 50 mm in a central direction from a periphery of the target material.

The temperature during the first cold rolling or the first cold forging is, for example, about 10° C. to 100° C.

The heat treatment after the first cold rolling or the first cold forging is preferably carried out at a temperature of from 200° C. to 500° C. for 0.5 hours to 3 hours. This is because recrystallization would not be sufficiently promoted at a lower temperature of less than 200° C. and strain partially would remain, while grains would become abnormally coarse at a higher temperature of more than 500° C. Further, if the heat treatment is carried out for a shorter period of time, recrystallization cannot be sufficiently promoted and strain may partially remain, while if it is carried out for a longer period of time, the grains may become abnormally coarse.

After the heat treatment, the second cold rolling or the second cold forging is further carried out. The change rate of the second cold rolling or the second cold forging is from 20% to 40%. This can allow introduction of strain into the target material to increase effectively the hardness of the manufactured sputtering target. Further, as a result of crystal grains being crushed in the thickness direction by carrying out the second cold rolling or the second cold forging, the flat ratio of the crystal grains in the above cross section of the sputtering target will be 0.35 or more and 0.65 or less.

If the change rate of the second cold rolling or the second cold forging is less than 20%, the hardness of the sputtering target cannot be sufficiently increased, and the risk of warpage during sputtering cannot be eliminated. On the other hand, if the change rate of the second cold rolling or the second cold forging is larger than 40%, a decrease in the recrystallization temperature due to the introduction of strain becomes remarkable and the sputtering target is softened due to the heat during sputtering, so that in this case, there is also a concern that the sputtering target may be warped.

From such a point of view, the change rate of the second cold rolling or the second cold forging is preferably from 20% to 40%, and more preferably from 25% to 35%.

The temperature during the second cold rolling or second cold forging is, for example, from about 10° C. to 100° C.

In the second cold rolling or the second cold forging, water cooling is preferably carried out every one pass of the rolling or forging or every one rolling or one forging, in order to prevent relaxation of the introduced strain due to the working heat of the rolling or forging.

Subsequently, finishing processing such as cutting can be performed as needed to manufacture a sputtering target.

Sputtering Target and Manufacturing Method According to Second Embodiment

A sputtering target according to this embodiment is of integrated type including: a disk-shaped target portion; and a backing plate portion which has substantially the same shape as the target portion and is integral with the target portion, in which both of the target portion and the backing plate portion are made of an equivalent copper alloy, and in which a Vickers hardness Hv is 90 or more, and a flat ratio of crystal grains in a cross section orthogonal to a sputtering surface is 0.35 or more and 0.85 or less. In the present embodiment, the sputtering target generally has a plate shape such as a disk shape, but may include other shapes. Whether or not the sputtering target is of integrated type can be determined by confirming whether or not materials of a front surface and a back surface of the sputtering target are the same as each other. Since the sputtering target is made of cupper, the determination can be made by measuring conductivity.

(Composition)

In the sputtering target according to the present embodiment, both of the target portion and the backing plate portion contain copper as a main component, and also contain at least one element selected from aluminum, manganese, nickel and cobalt as a sub component in an amount of from 0.1% by mass to 8% by mass, and it may further contain other elements as long as the Vickers hardness Hv as described below will be maintained to be 90 or more. Both of the target portion and the backing plate portion are made of a copper alloy having the same composition.

The total content of the sub components of the copper alloy forming the target portion and the backing plate portion is from 0.1% by mass to 8% by mass, when the sub components are a plurality of types of elements. If the content of the sub component is too high, conductivity is significantly reduced so that it is difficult to use the target as a wiring material. On the other hand, if the content of the sub component is too low, it may be difficult to produce a target in which the alloy component is uniformly dispersed. From this viewpoint, the content of the sub component is from 0.1% by mass to 8% by mass, and preferably from 0.1% by mass to 6% by mass, and more preferably from 0.2% by mass to 6% by mass. More suitably, the content of the sub component is 0.1% by mass or more as a lower limit, and preferably 0.2% by mass or more, and 8% by mass or less as an upper limit, and preferably 6% by mass or less, and more preferably 5% by mass or less, and even more particularly 4% by mass or less. Examples of a copper alloy sputtering target containing two or more types of sub components include those containing manganese and aluminum.

Both of the target portion and the backing plate portion may further contain, as impurities, one or more selected from the group consisting of Fe, Cr, Si, Ag, S and P, for example in a total amount of 0.01% by mass or less, and preferably 0.005% by mass or less. If the total content of the above elements is more than 0.01% by mass, serious defects may take place when used in semiconductor products.

However, the elements are not limited to those listed herein, and other elements can be contained as long as the Vickers hardness Hv of 90 or more can be ensured.

(Vickers Hardness)

The sputtering target according to the present embodiment has a Vickers hardness Hv of 90 or more. This can allow suppression of warpage during sputtering, even if the sputtering target provided with the backing plate portion which mainly consists of the copper alloy as in the target portion, and even if it is such a sputtering target having a diameter of more than 400 mm for example. As a result, effective sputtering can be carried out until the latter half of the life of the sputtering target. From this viewpoint, the Vickers hardness Hv of the sputtering target is 90 or more, and preferably 97 or more.

In addition, the generation of warpage in the sputtering target causes problems that uniformity of a thin film to be formed decreases and plasma falls. However, in this embodiment, since the sputtering target has the Vickers hardness Hv as described above, such problems are not caused.

The Vickers hardness Hv is measured in accordance with JIS Z2244 (2009). In the sputtering target in which the target portion and the backing plate portion are integrated, the Vickers hardness Hv of the target portion and the backing plate portion is substantially the same.

Such Vickers hardness Hv can be obtained, for example, by production according to the manufacturing method as described later.

(Average Crystal Grain Size)

In the sputtering target according to the embodiment, the average crystal grain size is preferably 5 μm or more and 50 μm or less. If the average crystal grain size is less than 5 μm, an erosion rate during sputtering may be decreased, and if it is more than 50 μm, film uniformity during sputtering may be deteriorated. Therefore, the average crystal grain size is more preferably 20 μm or more and 50 μm or less, and still more preferably 25 μm or more and 45 μm or less.

The average crystal grain size is measured by observation with an optical microscope. More particularly, as shown in FIG. 1, the average crystal grain size is determined by drawing two straight lines on the sputtering surface in each of a longitudinal direction and a lateral direction to draw four straight lines in total (see "Surface Texture" in FIG. 1), measuring an average grain size in a target thickness direction and an average grain size in a direction perpendicular to the target thickness direction based on the number of grain boundaries intersecting the straight lines, and averaging the average grain sizes in those respective directions.

(Flat Ratio of Crystal Grains)

In the sputtering target according to the embodiment, a flat ratio of crystal grains present in a cross section along a plane orthogonal to the sputtering surface is 0.35 or more and 0.85 or less.

The flat ratio is determined using an optical microscope as follows: total four arbitrary straight lines, two straight lines in each of a target thickness direction and a direction perpendicular to a target thickness direction of the crystal grains observed in the cross section, are drawn (see "Cross-sectional Texture" in FIG. 1), and the number of grain boundaries intersecting the straight lines are counted to measure an average grain size in the target thickness direction and an average grain size in the direction perpendicular to the target thickness; and then, when the average grain size in the target thickness direction is defined as a short side and the average grain size in the direction perpendicular to the target thickness direction is defined as a long side, the flat ratio is calculated from the equation: flat ratio=(1−short side/long side).

If the above flat ratio is less than 0.35, the strength would be insufficient because processing deformation of a recrystallized structure is not sufficient. On the other hand, if it is more than 0.85, a voltage may be too high due to large internal stress in the sputtering target when sputtering is performed, so that the life of the sputtering target may be shortened.

Therefore, in the sputtering target according to the embodiment, the flat ratio of crystal grains present in a cross section along a plane orthogonal to the sputtering surface is 0.35 or more and 0.85 or less, and preferably 0.40 or more and 0.60 or less, more preferably 0.45 or more and 0.55 or less.

The flat ratio of crystal grains of the cross section can be obtained, for example, by production according to the manufacturing method as described later.

(Manufacturing Method)

The sputtering target according to the embodiment can be manufactured, for example, as follows.

First, at least one element selected from aluminum, manganese, nickel and cobalt is added to high purity copper having a purity of 4N or 6N so as to have the predetermined composition as described above, and melted at a temperature of from 1080° C. to 1280° C. for 0.5 hours to 6 hours, and cooled and harden in a predetermined mold, thereby casting an ingot comprising the element copper and unavoidable impurities as a material for the sputtering target in which the target portion and the backing plate are integrated.

The ingot is then subjected to hot forging, first cold rolling or first cold forging, a heat treatment, and second cold rolling or second cold forging.

Here, the hot forging is preferably carried out at a temperature of from 300° C. to 900° C. This is because if the temperature during forging is less than 300° C., there is a risk of cracking in the ingot during forging, whereas if it is more than 900° C., copper is abnormally softened, which is dangerous, and abnormal grain growth during forging may take place due to the elevated temperature.

Here, the first cold rolling and the first cold forging are preferably carried out at a change rate of 70% or more, in terms of sufficiently destroying the cast structure. As used herein, the change rate R (%) means a ratio of dimensional changes in the thickness direction, represented by the equation: R=(T1−T2)/T1×100, in which T1 represents a thickness of a target material before rolling or forging, and T2 represents a thickness of a target material after rolling or forging. More particularly, in the case of rolling, the above change rate corresponds to a so-called rolling reduction, which is also calculated by the same equation. The same is true for change rates of the second cold rolling and the second cold forging which will be described later. When calculating the change rate, the thickness of the target material is measured by firstly confirming a sufficiently flat surface of the target material having a disk shape or the like by a flat rod as a base, and then measuring four thicknesses in a circumferential direction at a position of 50 mm in a central direction from a periphery of the target material.

The temperature during the first cold rolling or the first cold forging is, for example, about 10° C. to 100° C.

The heat treatment after the first cold rolling or the first cold forging is preferably carried out at a temperature of from 200° C. to 500° C. for 0.5 hours to 3 hours. This is because recrystallization cannot be sufficiently promoted at a lower temperature of less than 200° C. and strain may partially remain, while grains may become abnormally coarse at a higher temperature of more than 500° C. Further, if the heat treatment is carried out for a shorter period of time, recrystallization cannot be sufficiently promoted and strain may partially remain, while if it is carried out for a longer period of time, the grains may become abnormally coarse.

After the heat treatment, the second cold rolling or the second cold forging is further carried out. The change rate of the second cold rolling or the second cold forging is from 20% to 60%. This can allow introduction of strain into the target material to increase effectively the hardness of the manufactured sputtering target. Further, as a result of crystal grains being crushed in the thickness direction by carrying out the second cold rolling or the second cold forging, the flat ratio of the crystal grains in the above cross section of the sputtering target will be 0.35 or more and 0.85 or less. Furthermore, by controlling an amount of strain introduced into the target material in the second cold rolling or the second cold forging, an increase in sputtering voltage due to the internal stress during sputtering can be suppressed, so that the sputtering target can be used for a longer period of time.

If the change rate of the second cold rolling or the second cold forging is less than 20%, the hardness of the sputtering target cannot be sufficiently increased, and the risk of warpage during sputtering cannot be eliminated. On the other hand, if the change rate of the second cold rolling or the second cold forging is larger than 60%, the voltage is too high due to large internal stress in the sputtering target when sputtering is performed, so that the life of the sputtering target is shortened.

From such a point of view, the change rate of the second cold rolling or the second cold forging is preferably from 20% to 40%, in particular from 25% to 35%.

The temperature during the second cold rolling or second cold forging is, for example, from about 10° C. to 100° C.

In the second cold rolling or the second cold forging, water cooling is preferably carried out every one pass of the rolling or forging or every one rolling or one forging, in order to prevent relaxation of the introduced strain due to the processing heat of the rolling or forging.

Subsequently, finishing processing such as cutting can be performed as needed to manufacture a sputtering target.

EXAMPLES

Next, the sputtering target was experimentally manufactured and its effects were confirmed as described below. However, the description herein is merely for the purpose of illustration and is not intended to be limited thereto.

Test Example 1

High purity copper having a purity of 6N was melted in a crucible at a temperature of 1100° C. for 1 hour, and the resulting molten metal was then cast in a mold to form an ingot having a diameter of 220 mm and a thickness of 210 mm. The ingot was then subjected to hot forging at a temperature of 500° C. to have dimensions of a diameter of 160 mm and a thickness of 250 mm, and then subjected to first cold forging or first cold rolling to provide a target material having a diameter of 470 mm and a thickness of 45 mm. The target material was then subjected to a heat treatment at 300° C. for 1 hour and cooled, and then subjected to second cold rolling or second cold forging at each change rate as shown in Table 1. Further, the target material was subjected to cutting processing to produce a sputtering target in which a target portion and a backing plate portion were integrated.

In Examples 1-1 to 1-3 and Comparative Examples 1-1 and 1-2, sputtering targets were produced under the same conditions, with the exception that the change rate of the second cold rolling or the second cold forging after the heat treatment varied as shown in Table 1.

For each of Examples 1-1 to 1-3 and Comparative Examples 1-1 and 1-2, the Vickers hardness of each sample of the produced sputtering targets, and the Vickers hardness after further heating the sample at 140° C. for 1 hour, the average crystal grain size, and the flat ratio of crystal grains in a cross section were determined.

Further, sputtering was carried out to 2500 kWhr according to a recommended recipe using the sputtering targets of Examples 1-1 to 1-3 and Comparative examples 1-1 and 1-2, and the warpage of each target at the end of sputtering was measured. Here, the warpage of each target was determined by measuring the back surface of the target by means of a three-dimensional measuring device.

These results are also shown in Table 1.

Test Example 2

High purity copper having a purity of 6N and aluminum or manganese were placed in a crucible so as to have a predetermined composition, and melted in the crucible at a temperature of 1100° C. for 1 hour, and the resulting molten metal was then cast in a mold to form an ingot having a diameter of 220 mm and a thickness of 210 mm. The ingot was then subjected to hot forging at a temperature of 500° C. to have dimensions of a diameter of 160 mm and a thickness of 250 mm, and then subjected to first cold forging or first cold rolling to provide a target material having a diameter of 470 mm and a thickness of 45 mm. The target material was subjected to a heat treatment at 300° C. for 1 hour and cooled, and then subjected to second cold rolling or second cold forging at each change rate as shown in Table 2. Further, the target material was subjected to cutting processing to produce a sputtering target in which a target portion and a backing plate portion were integrated.

In Examples 2-1 to 2-9 and Comparative Examples 2-1 to 2-6, sputtering targets were produced under the same conditions, with the exception that the change rate of the second cold rolling or the second cold forging after the heat treatment varied as shown in Table 2.

TABLE 1

|  | Material | Impurities | Change Rate of Second Rolling (%) | Sample Vickers Hardness (Hv) | After Heating Vickers Hardness (Hv) | Average Crystal Grain Size (μm) | Flat Rate of Grains in a Cross Section (1 - Short Side/ Long Side) | Warpage after Sputtering (mm) |
|---|---|---|---|---|---|---|---|---|
| Example 1-1 | Cu | — | 20 | 93 | 80 | 45 | 0.36 | 0.9 |
| Example 1-2 | Cu | — | 30 | 100 | 70 | 40 | 0.51 | 0.6 |
| Example 1-3 | Cu | — | 40 | 104 | 70 | 35 | 0.64 | 0.5 |
| Comparative Example 1-1 | Cu | — | 10 | 81 | 83 | 40 | 0.19 | 2.1 |
| Comparative Example 1-2 | Cu | — | 50 | 106 | 55 | 35 | 0.75 | 1.7 |

The results shown in Table 1 demonstrate that Examples 1-1 to 1-3 where the second cold rolling or the second cold forging after the heat treatment was carried out at a change rate in the range of from 20% to 40% had higher measured values for the Vickers hardness, and as a result, the generation of warpage during sputtering was effectively suppressed.

On the other hand, Comparative Example 1-1 where the change rate of the second cold rolling or the second cold forging was less than 20% had lower measured values for the Vickers hardness, and larger warpage occurred during sputtering accordingly.

In Comparative Example 1-2 where the change rate of the second cold rolling or the second cold forging was higher than 40%, the measured values for the Vickers hardness were increased, but relatively large warpage occurred during sputtering. Considering that the Vickers hardness is reduced after heating in Comparative Example 1-2, it is believed that in Comparative Example 1-2, the recrystallization temperature decreases as strain is introduced, and when large strain is introduced at the change rate of about 50%, the softening due to heat during sputtering occurs, thereby causing the large warpage.

For each of Examples 2-1 to 2-9 and Comparative Examples 2-1 to 2-6, the Vickers hardness, the average crystal grain size, and the flat ratio of crystal grains in a cross section of each of produced sputtering targets were determined.

Further, sputtering was carried out to 3200 kWhr according to a recommended recipe using the sputtering targets of Examples 2-1 to 2-9 and Comparative examples 2-1 to 2-6, and a target life and warpage of each target at the end of sputtering were measured.

It should be noted that the target life was obtained as power consumption (power×time) during sputtering. As the power consumption is higher, the sputtering can be carried out at higher power for a longer period of time, which means that the life of the sputtering target is longer. Further, the warpage of each target was determined by measuring the back surface of the target by means of a three-dimensional measuring device.

These results are also shown in Table 2. It should be noted that since the target life greatly depends on the sputtering conditions, Table 2 also shows indices normalized on the basis of Example 2-1.

TABLE 2

|  | Material | Composition (% by mass) | Change Rate of Second Rolling (%) | Vickers Hardness (Hv) | Average Crystal Grain Size (μm) | Flat Rate of Grains in a Cross Section (1 - Short Side/ Long Side) | Target Life (Normarized) | Warpage after Sputtering (mm) |
|---|---|---|---|---|---|---|---|---|
| Example 2-1 | CuAl | 0.1 | 20 | 99 | 30 | 0.36 | 100% | 0.8 |
| Example 2-2 | CuAl | 0.1 | 30 | 105 | 35 | 0.51 | 100% | 0.4 |
| Example 2-3 | CuAl | 0.1 | 60 | 113 | 25 | 0.84 | 100% | 0.4 |
| Example 2-4 | CuMn | 0.5 | 20 | 100 | 35 | 0.36 | 100% | 0.9 |
| Example 2-5 | CuMn | 0.5 | 30 | 109 | 30 | 0.51 | 100% | 0.3 |
| Example 2-6 | CuMn | 0.5 | 60 | 116 | 20 | 0.84 | 100% | 0.7 |
| Example 2-7 | CuMn | 4.0 | 20 | 121 | 15 | 0.36 | 100% | 0.3 |
| Example 2-8 | CuMn | 4.0 | 30 | 130 | 10 | 0.51 | 100% | 0.4 |
| Example 2-9 | CuMn | 4.0 | 60 | 138 | 10 | 0.84 | 100% | 0.3 |
| Comparative Example 2-1 | CuAl | 0.1 | 10 | 80 | 30 | 0.19 | 1% | 2.0 |
| Comparative Example 2-2 | CuAl | 0.1 | 90 | 128 | <5 | 0.99 | 79% | 1.1 |
| Comparative Example 2-3 | CuMn | 0.5 | 10 | 84 | 30 | 0.19 | 1% | 2.2 |
| Comparative Example 2-4 | CuMn | 0.5 | 90 | 131 | <5 | 0.99 | 84% | 0.9 |
| Comparative Example 2-5 | CuMn | 4.0 | 10 | 88 | 15 | 0.19 | 1% | 2.1 |
| Comparative Example 2-6 | CuMn | 4.0 | 90 | 144 | <5 | 0.99 | 90% | 0.5 |

The results shown in Table 2 demonstrate that Examples 2-1 to 2-9 where the second cold rolling or the second cold forging after the heat treatment was carried out at a change rate in the range of from 20% to 60% had higher measured values for the Vickers hardness, and as a result, the generation of warpage during sputtering was effectively suppressed.

On the other hand, Comparative Examples 2-1, 2-3 and 2-5 where each change rate of the second cold rolling or the second cold forging was less than 20% had lower measured values for the Vickers hardness, and larger warpage occurred during sputtering accordingly.

Comparative Examples 2-2, 2-4 and 2-6 where each change rate of the second cold rolling or the second cold forging was higher than 60% had increased measured values for the Vickers hardness, but they resulted in increased flat ratios of crystal grains in a cross section. This resulted in an increased voltage during sputtering due to an increase in internal stress, thereby reaching the limit of the apparatus in the latter half of the life.

According to Examples as described above, it was found that an integrated sputtering target that can be manufactured at low cost can increase hardness of the target to suppress warpage during sputtering effectively.

What is claimed is:

1. An integrated sputtering target comprising a target portion and a backing plate portion, both of them containing from 0.1% by mass to 8% by mass of at least one element selected from aluminum, manganese, nickel and cobalt, the balance being copper and unavoidable impurities, wherein a Vickers hardness Hv is 90 or more, and wherein a flat ratio of crystal grains in a cross section orthogonal to a sputtering surface to be used for sputtering is 0.35 or more and 0.85 or less.

2. The sputtering target according to claim 1, wherein the sputtering target has an average crystal grain size of 5 μm or more and 50 μm or less.

3. The sputtering target according to claim 1, wherein the target portion and the backing plate portion further contain one or more elements selected from the group consisting of Fe, Cr, Si, Ag, S, and P in a total nonzero amount of 0.01% by mass or less.

4. The sputtering target according to claim 1, wherein the sputtering target contains from 0.1% by mass to 6% by mass of at least one element selected from aluminum, manganese, nickel, and cobalt.

5. A method for manufacturing the integrated sputtering target according to claim 1, the method comprising:
   melting a raw material to cast an ingot comprising the element, copper and the unavoidable impurities; and
   subjecting the ingot to hot forging, first cold rolling or first cold forging, a heat treatment, and a second cold rolling or a second cold forging in this order,
   wherein the second cold rolling or the second cold forging is carried out at a change rate of from 20% to 60%, and
   wherein in the second cold rolling or the second cold forging, crystal grains are crushed in a thickness direction to change a flat ratio of the crystal grains in a cross section orthogonal to a sputtering surface to be used for sputtering.

6. The method according to claim 5, wherein the heat treatment is carried out at a temperature of from 200° C. to 500° C. for 0.5 hours to 3 hours.

7. The method according to claim 5, wherein the first cold rolling or the first cold forging is carried out at a change rate of 70% or more.

8. The method according to claim 5, wherein the hot forging is carried out at a temperature of from 300° C. to 900° C.

9. The method according to claim 5, wherein the ingot further contains one or more elements selected from the group consisting of Fe, Cr, Si, Ag, S, and P in a total amount of 0.01% by mass or less.

10. The method according to claim 5, wherein the method manufactures a sputtering target containing 0.1% by mass to 6% by mass of at least one element selected from aluminum, manganese, nickel, and cobalt.

* * * * *